United States Patent
Xu et al.

(10) Patent No.: US 8,400,337 B1
(45) Date of Patent: Mar. 19, 2013

(54) OFFSET CANCELLATION BY BIASING THE BODY OF A TRANSISTOR

(75) Inventors: Danfeng Xu, Cupertino, CA (US); Jenn-Gang Chern, Redwood City, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 161 days.

(21) Appl. No.: 12/987,893

(22) Filed: Jan. 10, 2011

Related U.S. Application Data (60) Provisional application No. 61/336,932, filed on Jan. 27, 2010.

(51) Int. Cl.
*H03M 1/06* (2006.01)
*H03K 3/011* (2006.01)

(52) U.S. Cl. .................. 341/118; 327/307; 327/534

(58) Field of Classification Search ........... 341/118–120
See application file for complete search history.

(56) References Cited

U.S. PATENT DOCUMENTS

| | | | |
|---|---|---|---|
| 4,237,387 A * | 12/1980 | Devendorf et al. ........... 327/223 |
| 4,972,141 A | 11/1990 | Rozman et al. |
| 5,525,985 A | 6/1996 | Schlotterer et al. |
| 5,606,320 A | 2/1997 | Kleks |
| 5,774,733 A | 6/1998 | Nolan et al. |
| 5,861,829 A | 1/1999 | Sutardja |
| 6,118,395 A | 9/2000 | Kim |
| 6,191,715 B1 | 2/2001 | Flowers |
| 6,211,747 B1 | 4/2001 | Trichet et al. |
| 6,275,094 B1 * | 8/2001 | Cranford et al. ............... 327/534 |
| 6,411,233 B1 | 6/2002 | Sutardja |
| 6,459,335 B1 | 10/2002 | Darmawaskita et al. |
| 6,556,154 B1 | 4/2003 | Gorecki et al. |
| 6,822,600 B1 | 11/2004 | Taft et al. |
| 7,129,871 B1 | 10/2006 | Venes et al. |
| 7,250,880 B2 | 7/2007 | Hurrell et al. |
| 7,319,419 B1 | 1/2008 | Lash et al. |
| 7,362,246 B2 * | 4/2008 | Park et al. ..................... 341/118 |
| 7,456,766 B2 | 11/2008 | Keehr |
| 7,527,752 B2 | 5/2009 | Yoon et al. |
| 7,528,752 B1 | 5/2009 | Chern |
| 7,554,380 B2 * | 6/2009 | Embabi et al. ................. 327/356 |
| 7,642,620 B2 * | 1/2010 | Tanaka ........................... 257/536 |
| 7,848,045 B1 | 12/2010 | Li et al. |
| 2010/0117876 A1 * | 5/2010 | Cao et al. ..................... 341/118 |

OTHER PUBLICATIONS

Gebara et al., A Body-Driven Offset Cancellation Technique in PD-SOI, IEEE, Proc. 24th International Conference on Microelectronics (MIEL 2004), vol. 2, NIS, Serbia and Montenegro, May, 16-19, 2004, pp. 567-570.*

McCarroll et al., "A High-Speed CMOS Comparator for Use in an ADC," IEEE Journal of Solid-State Circuits, vol. 23, No. 1, Feb. 1988.

* cited by examiner

*Primary Examiner* — Howard Williams
(74) *Attorney, Agent, or Firm* — Van Pelt, Yi & James LLP (57) ABSTRACT

Offset is canceled by determining a voltage level to set a body input of a transistor to. The body input of the transistor is set to the determined voltage level to cancel offset associated with the transistor.

21 Claims, 9 Drawing Sheets

OFFSET CANCELLATION BY BIASING THE BODY OF A TRANSISTOR

CROSS REFERENCE TO OTHER APPLICATIONS

This application claims priority to U.S. Provisional Patent Application No. 61/336,932 entitled OFFSET CANCELLATION FOR CMOS FLASH ADC filed Jan. 27, 2010 which is incorporated herein by reference for all purposes.

BACKGROUND OF THE INVENTION

Generally, offset voltages may be introduced into a circuit as a result of component variations arising from non-ideal manufacturing processes. Such offset voltages may affect normal circuit operation. Thus, there is a need to cancel or compensate for offset voltages.

In a more specific example, some integrated circuit technologies (e.g., complementary metal-oxide-semiconductor (CMOS)) suffer from offset. In a perfect system, transistors are perfectly matched and the same voltage applied at the gate of each transistor causes the transistor to switch identically. Put another way, perfect transistors in an integrated circuit have the same switching voltage. However, in the real world each transistor has slight differences. Offset can be modeled as a voltage at the gate of a transistor, and the voltage could be different between transistors. Circuit designs which rely upon matched transistors (e.g., CMOS analog to digital converters (ADC)) often attempt to compensate for this by performing offset cancellation.

A number of offset cancellation techniques exist but these existing techniques have drawbacks associated with them. Some techniques have a size penalty because required components are larger than desired and/or are not the smallest such component. More specifically, some solutions require certain types of transistors and these transistors tend to be larger. For high speed application and high integration, it would be desirable to use smaller transistors. Another issue is power consumption. Some offset cancellation techniques consume (DC) power. This is unattractive, especially for these low power applications, such as mobile or portable applications. Other solutions incorporate capacitors, which may slow down the speed at which the system can operate since capacitors may increase the loading of the critical path. It would be desirable if new offset cancellation techniques could be developed which overcome one or more of these obstacles.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
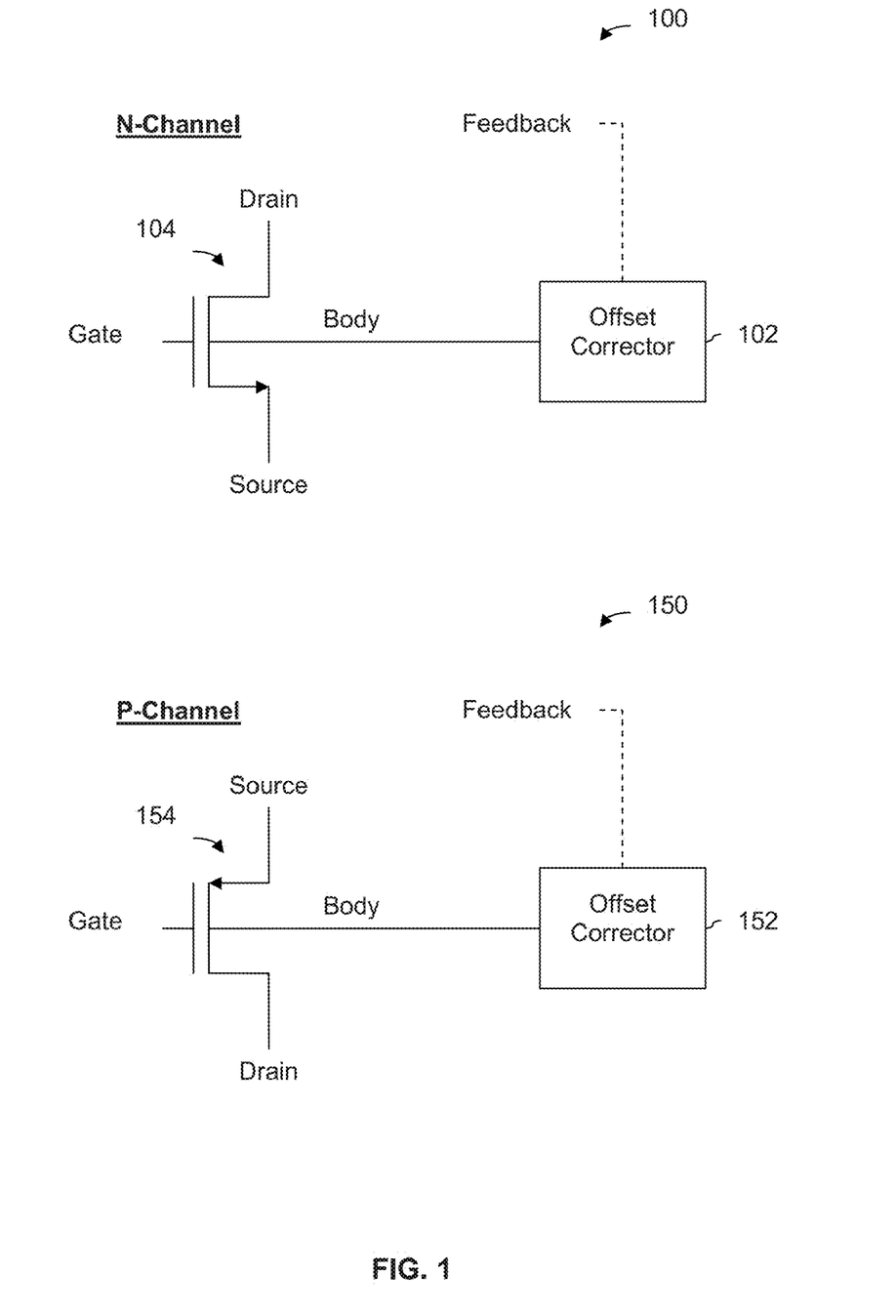
FIG. 1 is a diagram illustrating an embodiment of an n-channel transistor and a p-channel transistor in which the bodies are biased to correct for offset.

FIG. 1 is a diagram illustrating an embodiment of an n-channel transistor and a p-channel transistor in which the bodies are biased to correct for offset. In the example shown, diagram 100 shows a system with an n-channel transistor and diagram 150 shows a system with a p-type transistor. Although some of the symbols shown or transistor types described in this or other figures may be associated with a particular polarity or type of integrated circuit technology, the technique is applicable across a variety of integrated circuit types and technologies.

In diagram 100, offset corrector 102 determines a voltage at which to set the body of transistor 104. Typically, a transistor is modeled or represented as having three terminals (e.g., a gate, drain and source although other types of transistors may use different terms) and those inputs are connected to other nodes in a system. In this technique, there is a fourth terminal (i.e., the body input, also referred to as the body) which is connected to a node in the system.

The voltage at which the body of transistor 104 is set to is selected by offset corrector 102 in order to cancel offset. Some examples of how this voltage is selected are described in further detail below. In some embodiments, offset corrector 102 uses a feedback signal (e.g., which comes from or is affected by transistor 104) to determine what voltage to set transistor 104 to. In various embodiments, a transistor which corrects offset by biasing the body is used in a variety of systems or circuit designs, such as amplifiers or ADCs.

FIG. 150 shows offset corrector 152 performing offset correction by adjusting or otherwise setting the body of p-channel transistor 154 to an appropriate voltage. In some embodiments, a feedback signal is used to determine what voltage to set the body of transistor 154 to; the feedback signal may come from or be affected by transistor 154. As shown herein, the technique is applicable to both n-channel and p-channel type transistors.

A number of advantages arise from performing offset cancellation as shown. With respect to power, correcting offset using this technique consumes less power than some other offset correction techniques. Also, because biasing of the body does not occur in the signal path (e.g., the signal path includes the gate to drain path of transistor 104 in some circuit designs), bandwidth is not affected and the system does not slow down compared to offset correction techniques which use capacitors. Another attractive feature of the invention is that is not limited to certain (larger) types of transistors. Certain smaller transistors (such as core transistors) which are attractive because of their smaller size may be used together with this offset correction technique. The smaller transistors will make circuit faster and the area smaller.

Figure 2:
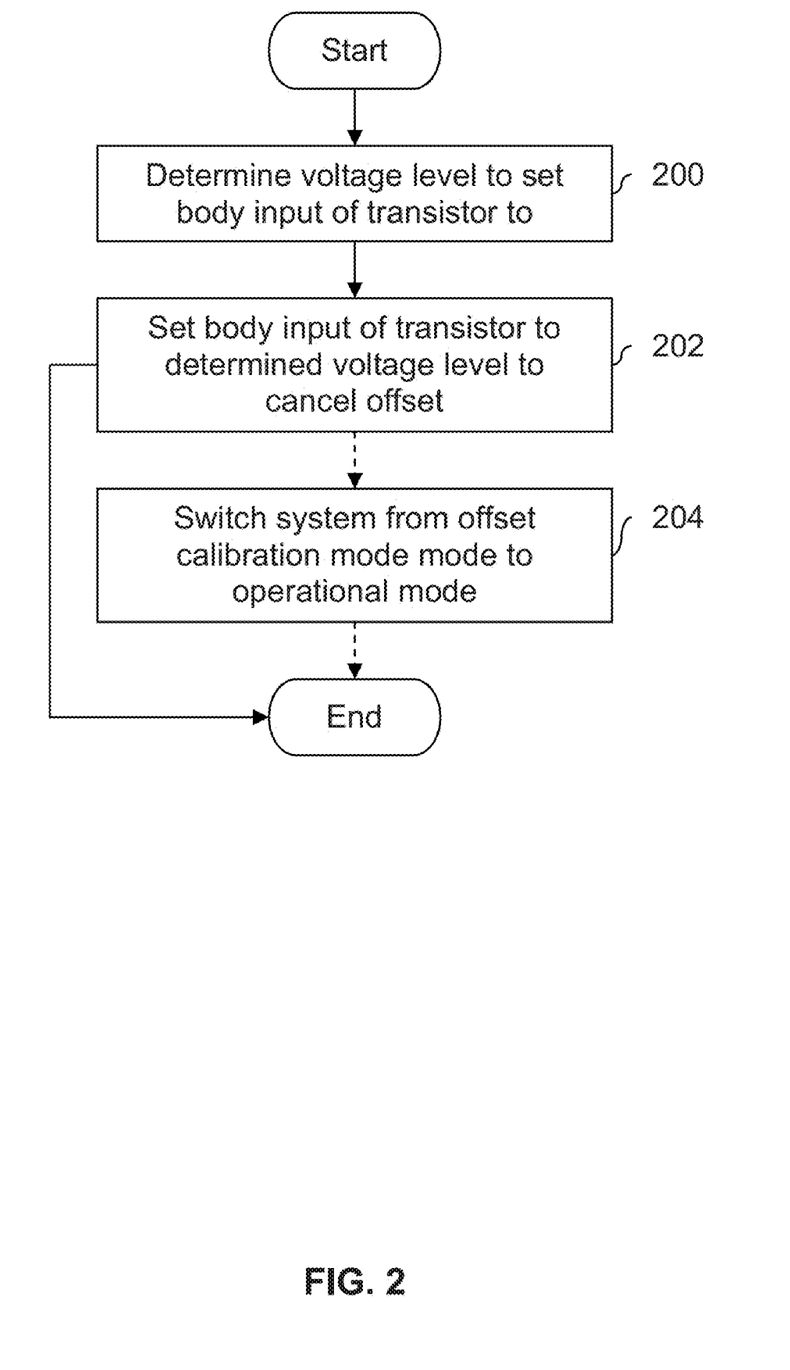
FIG. 2 is a flowchart illustrating an embodiment of a process for performing offset cancellation.

FIG. 2 is a flowchart illustrating an embodiment of a process for performing offset cancellation. In some embodiments, the process is performed by offset corrector 102/152 shown in FIG. 1. At 200, the process begins by determining a voltage level to set the body input of a transistor to. In some embodiments, a sweep of voltages is performed and the voltage with the best result is selected. In some embodiments, a desired voltage is one that causes two transistors (e.g., two transistors in a matched pair) to switch (on) at the same gate voltage. This may include comparing a first and second signal associated with a first and second transistor, respectively, in a matched pair.

At 202, the body input of a transistor is set to the determined voltage level to cancel offset. In some embodiments, the step of determining a voltage level at 200 and setting the voltage at 202 is performing by a manufacturer and/or at the factory. In some embodiments, once set, the voltage of the body of a transistor is kept to the same level (e.g., during usage of the system by an end user). In some embodiments, there is a utility or tool which permits an end user, application, operating system or other entity to determine a new voltage level and apply the new voltage level to the body of the transistor.

In some embodiments, the process ends at step 202. In some systems, however, the system has at least two configurations or settings: an offset calibration mode (during which appropriate voltages are determined and set for the body inputs of transistors) and an operational mode (during which the regular or primary functionality of the system is performed). In some embodiments, there are some (electrical) paths or connections with are active in the offset calibration mode but which are not active in the operational mode. The converse may also be true. For systems so configured, a system is switched from an offset calibration mode to an operational mode at 204. In various embodiments, this includes opening/closing switches so that certain electrical paths or connections are enabled/disabled, changing the select pin on a multiplexer so that the A input is selected as opposed to the B input, etc.

Figure 3A:
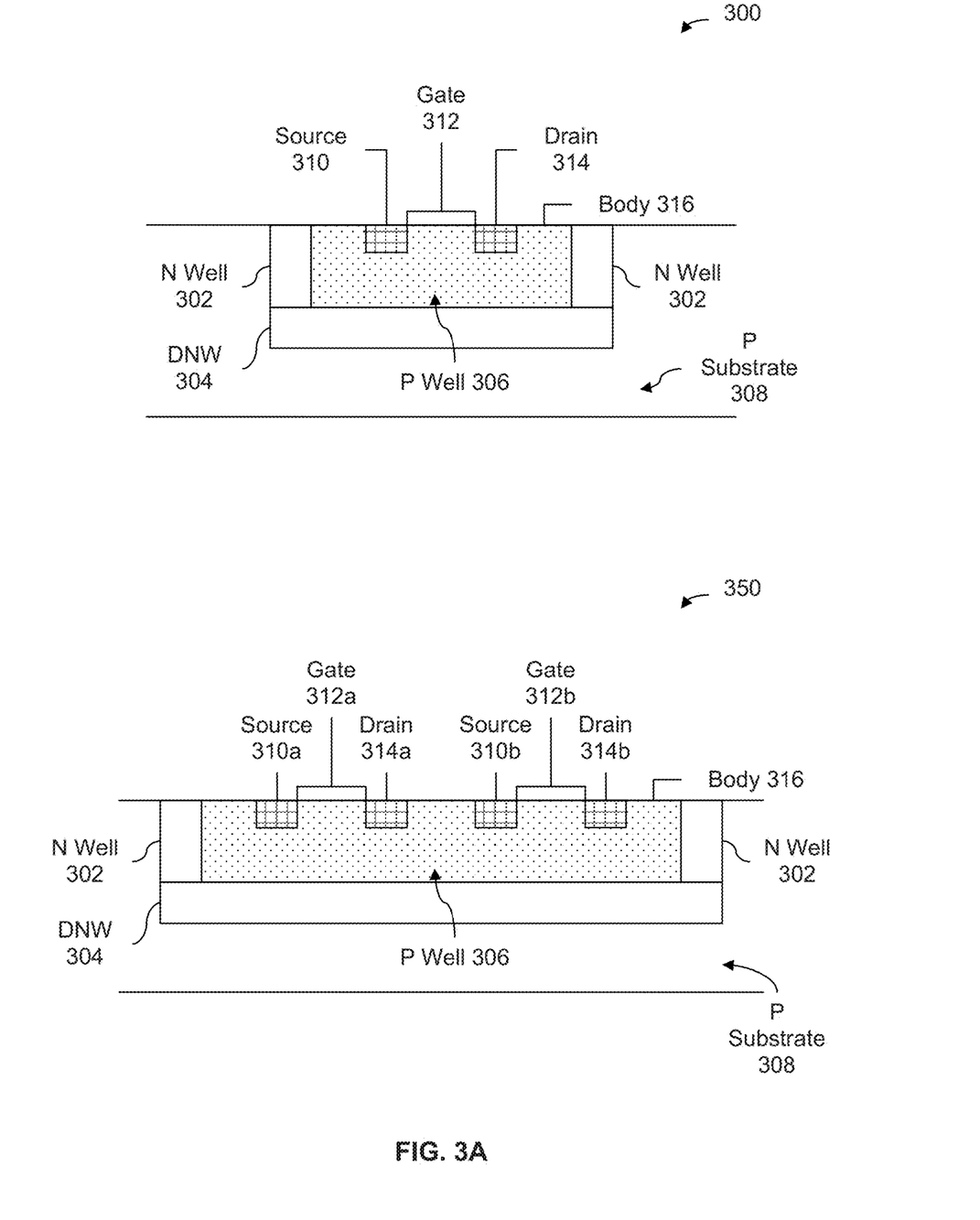
FIG. 3A is a diagram showing an embodiment of a side view of one and two transistors, respectively, for which offset cancellation is performed by biasing the body for a NMOS configuration.

FIG. 3A is a diagram showing an embodiment of a side view of one and two NMOS transistors, respectively, for which offset cancellation is performed by biasing the body for a NMOS configuration. In some embodiments, silicon on insulator (SOI) transistors are used. The diagrams shown are merely exemplary and are not necessarily to scale nor are they necessarily indicative of any required geometries/shapes. In various embodiments, various dimensions, geometries and/or integrated circuit application/removal processes may be employed.

In diagram 300, a single transistor is shown. The four pins or terminals of the transistor in diagram 300 are source 310, gate 312, drain 314 and body 316. The body input (316) is connected to p well 306 which is electrically isolated from p substrate 308 by DN well 304 at the bottom and n well 302 on the sides. Via body pin 316, p well 306 is set to a voltage which cancels or otherwise eliminates offset. Although this example shows three separate elements (i.e., n well 302 (left and right) and p well 306) separating p well 306 from p substrate 308, any number of elements and/or shapes may be used. For example, a single, monolithic piece may separate p substrate 308 from p well 306. In some embodiments, the edges may be curved.

Diagram 350 shows an example in which two transistors share the same well and are biased by the same voltage. A first transistor (on the left) includes source 310a, gate 312a and drain 314a as inputs. A second transistor (on the right) includes source 310b, gate 312b and drain 314b as inputs. Both transistors share a single body input or pin 316. Via body 316, p well 306 is set to a voltage that cancels or otherwise reduces offset for both transistors. P well 306 is electrically isolated from p substrate 308 because of n well 302 and DN well 304.

In some embodiments, it is desirable for matched transistor pairs to have no offset between them (i.e., they switch when the same voltage at applied the gate). In some embodiments, the two transistors shown in diagram 350 are not associated with the same matched pair. For example, the transistor on the left may be part of a first matched pair (its partner not shown) and the transistor on the right may be part of a second matched pair (its partner also not shown). This may be desirable since having both transistors in a matched pair inhabit the same well (e.g., p well 306) and being set to the same voltage may not necessarily reduce offset. In some embodiments, there may be two matched pairs working in tandem. The first transistor from the first pair and the first transistor from the second pair may share the same body bias as in 350; and the second transistor from the first pair and the second transistor from the second pair may share the same body as in 350, but the first body and second body are separate from each other. By adjusting the voltage between the first and second bodies the amplifier offset can be reduced.

In some embodiments, having two or more transistors share the same well and/or same body voltage is desirable. For example, a higher density may be achieved with the 2:1 ratio of transistors to wells shown in diagram 350 compared to the 1:1 ratio shown in diagram 300. In various embodiments, any number of transistors may share the same well.

Figure 3B:
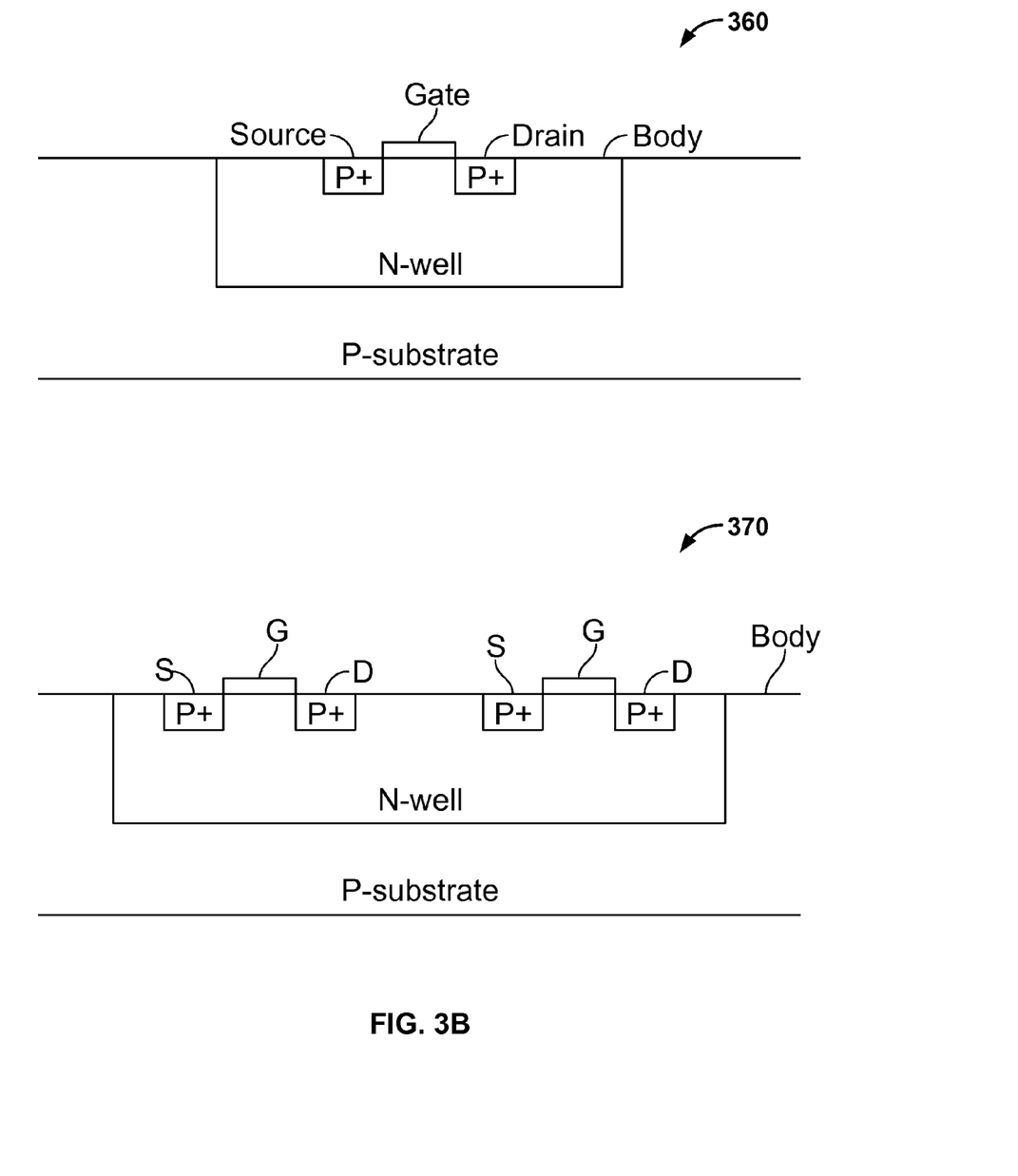
FIG. 3B is a diagram showing an embodiment of a side view of one and two transistors, respectively, for which offset cancellation is performed by biasing the body for a PMOS configuration.

FIG. 3B is a diagram showing an embodiment of a side view of one and two transistors, respectively, for which offset cancellation is performed by biasing the body for a PMOS configuration. In the examples shown, diagram 360 shows a single transistor embodiment and diagram 370 shows two transistors sharing the same n-well and body input.

Figure 4:
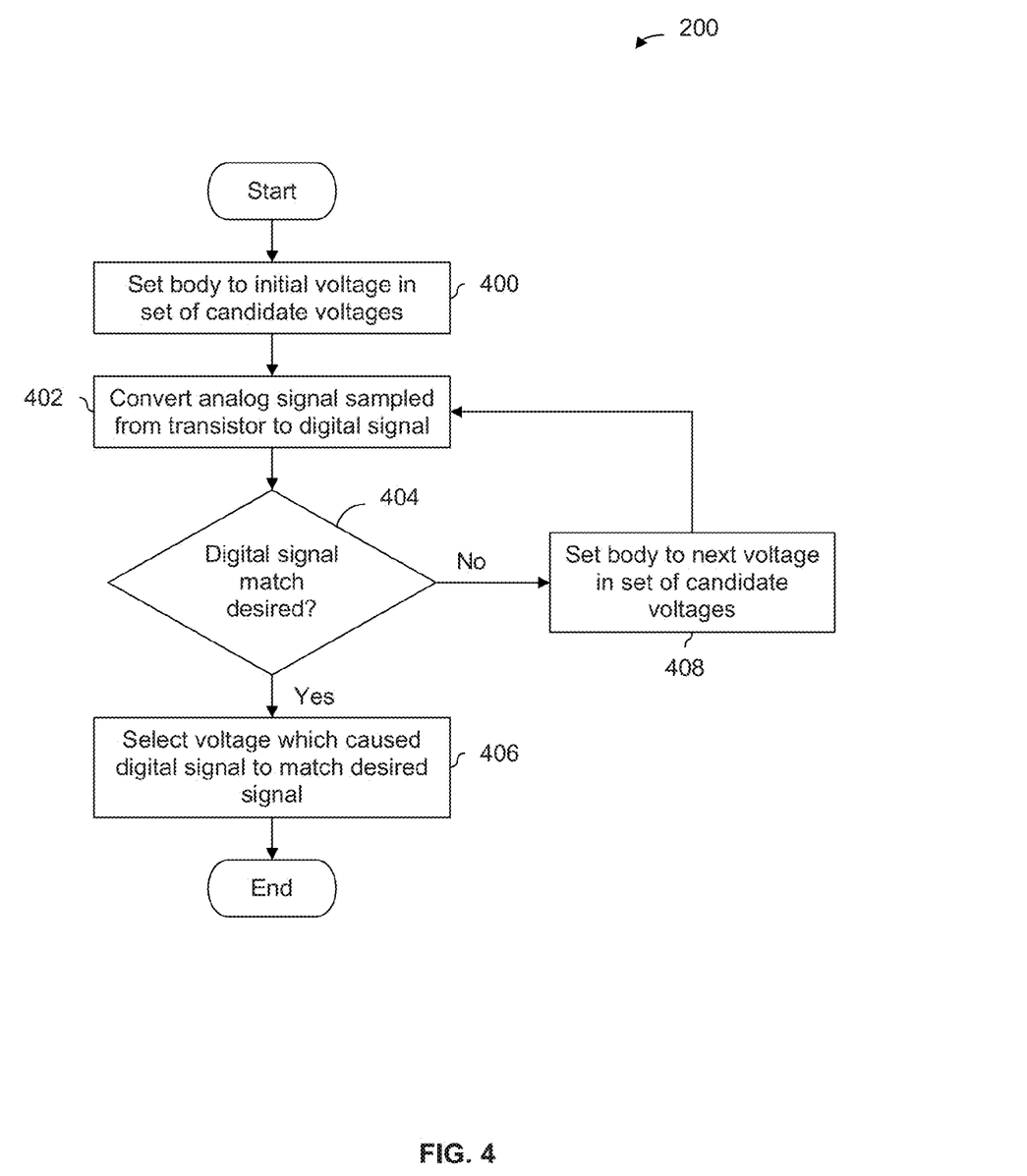
FIG. 4 is a flowchart illustrating an embodiment of a process for determining a voltage level at which to bias the body of a transistor by testing different voltages.

FIG. 4 is a flowchart illustrating an embodiment of a process for determining a voltage level at which to bias the body of a transistor by testing different voltages. In some embodiments, the example process is used at step 200 in FIG. 2. In some embodiments, this process is performed (e.g., in parallel) for each body input which must be set. In other embodiments, the process progresses through each body input serially (i.e., one at a time).

At 400, the body is set to an initial voltage in a set of candidate voltages. For example, body input 316 in diagram 300/350 in FIG. 3 is set to the initial voltage. At 402, an analog signal sampled from a transistor is converted to a digital signal. In this example, the component or processor which performs determines what voltage to set the body to is at least partially digital and so the signal is converted into a digital signal. The analog signal of step 402 may be sampled from a variety of points, including a signal path. Referring back to diagram 100 in FIG. 1, for example, a sample may be taken from the drain of transistor 104 (because that node is part of the signal path).

At 404 it is determined if the digital signal matches a desired one. In some embodiments, the transistor is part of a matched pair and it is determined if the two transistors are switching (on) at the same point. In cases where a single transistor is engaged only, the body could be used to alter the output level of an amplifier, for example, whose output might be set to a desirable level. If the digital signal does not match the desired signal, then the body is set to a next voltage in the set of candidate voltages at 408. In various embodiments, the search is performed in a variety of ways (which may dictate how the next voltage is selected at 408). In some embodiments, a linear search (i.e., "sweep") is performed where the process begins with the lowest (highest) voltages and progresses through the candidate voltages until the highest (lowest) candidate voltage is reached. In some other embodiments, a binary search is performed where the process maintains a range of remaining (e.g., versus eliminated) voltages. At each iteration, the range of remaining voltages is divided in half and the next voltage is selected to determine which half to eliminate and which half still remains. After setting the body to the next voltage at 408, an analog signal sampled from the transistor is converted to a digital signal at 402. If the digital signal does match the desired signal at 404, then the voltage which caused the digital signal to match a desired signal is selected.

Figure 5:
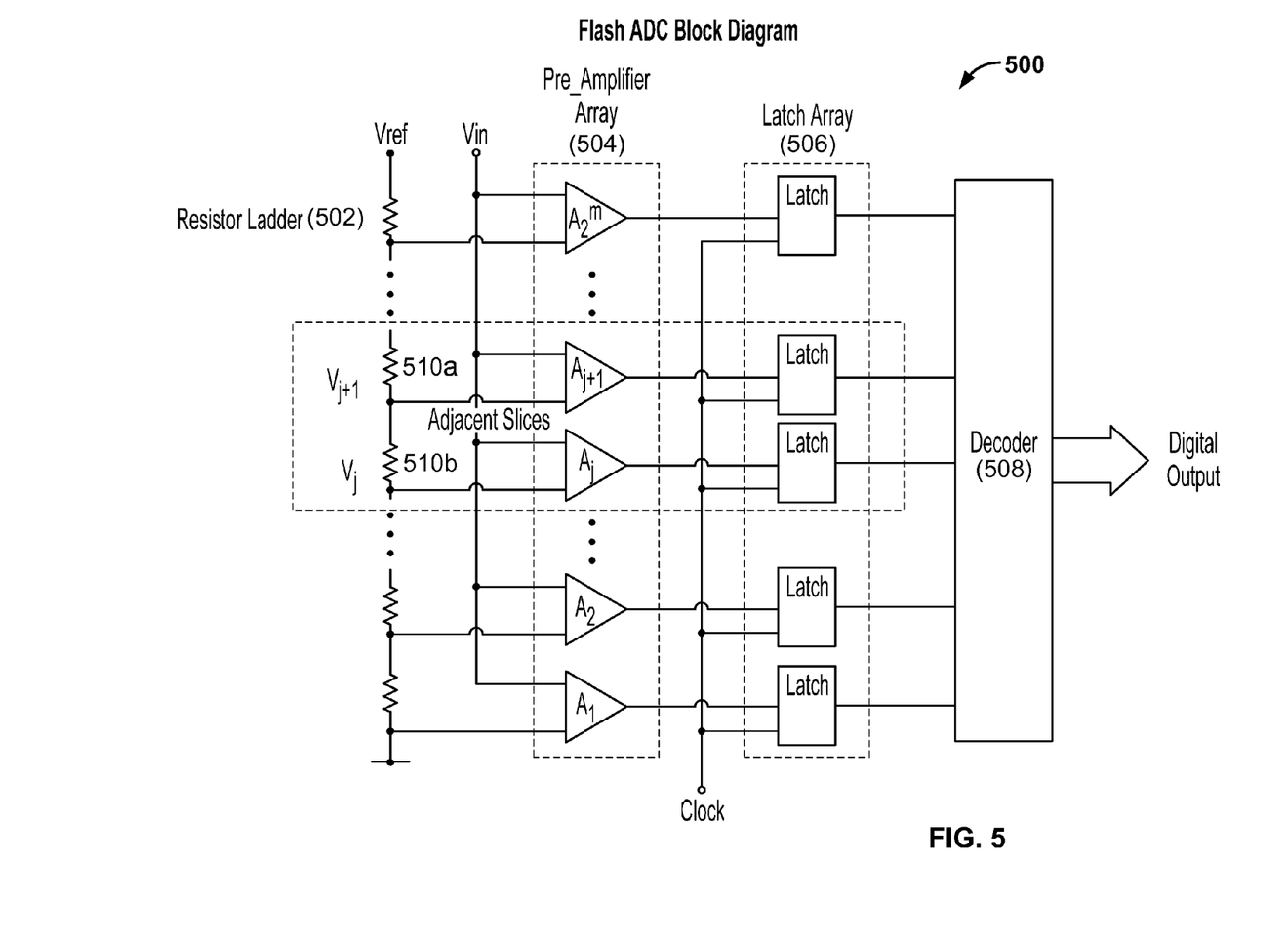
FIG. 5 illustrates a block diagram of an embodiment of an analog-to-digital converter (ADC).

FIG. 5 illustrates a block diagram of an embodiment of an analog-to-digital converter (ADC). ADC 500 in the given example comprises a flash ADC. As depicted, ADC 500 includes a reference ladder 502 that generates a series of reference voltages that define the thresholds of the ADC 500; a preamplifier array 504 that amplifies the difference between $V_{in}$ (signal) and $V_{ref}$ (reference voltage); a latch array 506 that converts analog voltages to digital voltages, e.g., on clock edges; and encoder logic 508 that compresses the latch outputs to a compact digital format. ADC 500 is comprised of a plurality of slices. The number of slices included in an ADC depends on the resolution of the ADC. For example, an ADC with a resolution of six bits includes sixty-four slices (since $2^6=64$). Two slices 510(a) and 510(b) of ADC 500 are depicted in FIG. 5. A different threshold or reference voltage from reference ladder 502 is associated with each slice. The least significant bit (LSB) of an ADC is the minimum increment of voltage (i.e. the step size between the reference voltages of the reference ladder 502) that the ADC can convert and depends on the operating input voltage range of the ADC. The operation of ADC 500 includes comparing an analog input voltage ($V_{in}$) with the reference voltage ($V_{ref}$) of each slice and generating a digital output for each slice. For example, if $V_{in}$ is greater than the $V_{ref}$ of a slice, the digital output of that slice may be a one; and if $V_{in}$ is less than the $V_{ref}$ of a slice, the output of that slice may be a zero. The digital outputs of all the slices are compressed into a more compact code by encoder 508. For example, the sixty-four digital outputs of sixty-four slices can be compressed into a six bit code.

Accuracy of the effective reference voltages is needed in order for an ADC to behave linearly. However, the accuracy of reference voltages may be compromised due to offset voltages arising from component variations, such as MOSFET threshold and/or mobility mismatches, random variations of resistors and/or capacitors, etc., that result from non-ideal manufacturing processes. Such a problem is especially pronounced when an ADC is realized in CMOS processes since in such cases the resulting net offset voltages tend to be relatively large compared to the LSB size of the ADC due to the use of relatively small transistors to achieve high speeds. Shifts in reference voltages from their ideal values may result from offset voltages contributed by any component and/or stage of an ADC. In some cases, offset voltages primarily occur in the preamplifier and/or latch. Because the reference ladder can be realized using relatively well matched components, e.g., using resistors and/or capacitors, in some cases, the reference ladder contributes relatively small amounts of offset voltages. The latches, on the other hand, could contribute significantly to the overall offset voltages due to, for example, their small sizes (for high speed and low power) and relatively low gain in the preamplifier array which may not provide enough offset attenuation.

For each slice, the various built-in offset voltages that arise throughout the slice can be referred back to the input stage and be represented by a single cumulative input offset voltage ($V_{offset}$). This offset voltage ($V_{offset}$) appears to be effectively added to the ideal reference voltage ($V_{ref}$) associated with the slice. For example, instead of $V_{ref}$, $V_{ref}$-$V_{offset}$ effectively appears at the preamplifier input of the slice. This shift in $V_{ref}$ from its ideal value due to $V_{offset}$ may cause a corresponding shift in an associated decision (transition) boundary and may cause the transfer code associated with the slice to shift from an ideal value. Thus, in order for an ADC to properly operate, the offset voltage $V_{offset}$ may need to at least in part be compensated for. An offset cancellation scheme may be employed to compensate for or at least mitigate the offset voltage $V_{offset}$. For example, the effect of $V_{offset}$ can be (mostly) cancelled if another offset voltage of the same or nearly the same magnitude but opposite polarity is cascaded with $V_{offset}$.

Figure 6:
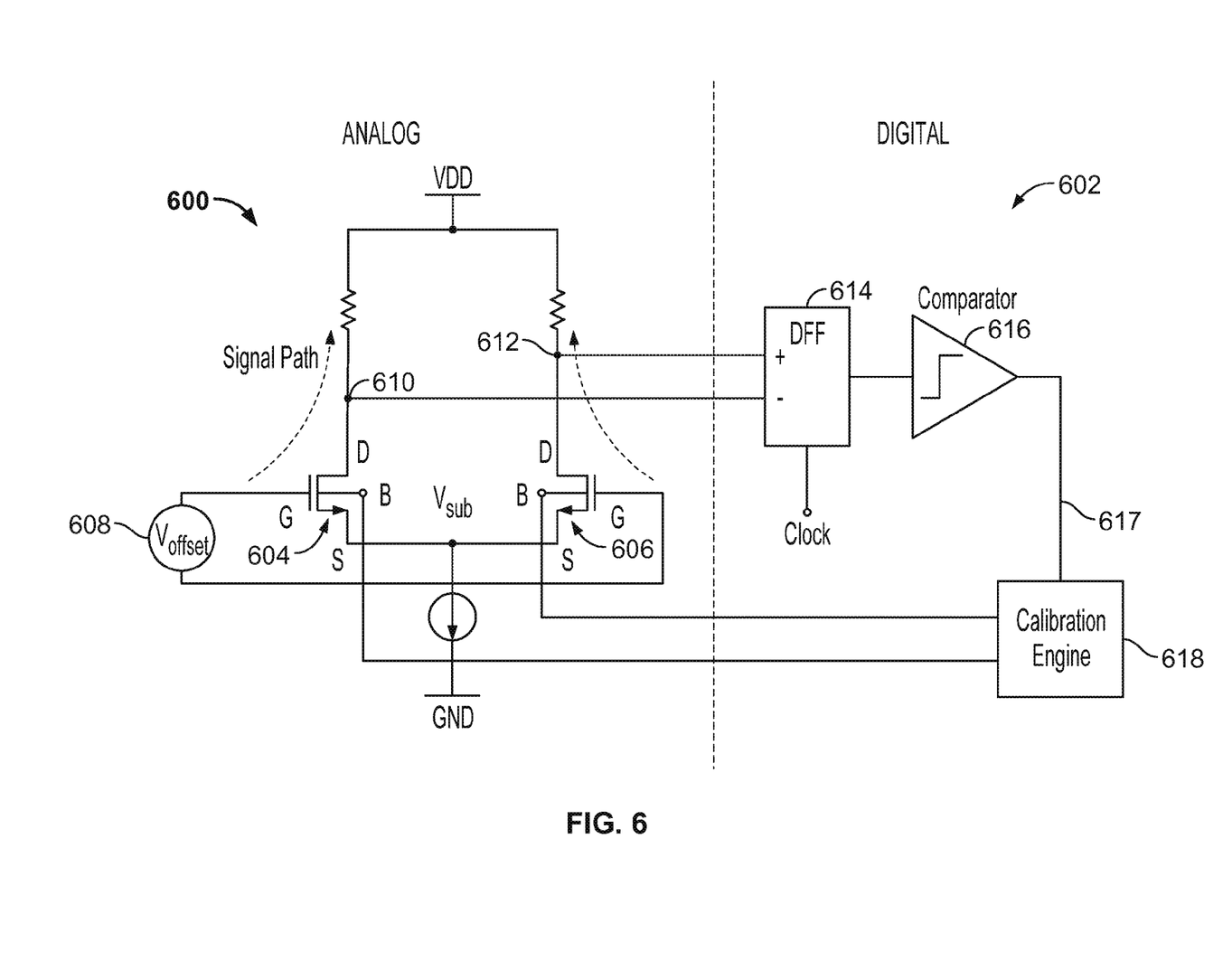
FIG. 6 is a diagram showing an embodiment of an ADC slice pre-amplifier for which the body voltage is being determined using digital calibration circuits.

FIG. 6 is a diagram showing an embodiment of an ADC slice pre-amplifier for which the body voltage is being determined using digital calibration circuits. In the example shown, a dashed line separates the analog components (600) from the digital components (602). To clearly demonstrate the technique, the ADC slice pre-amplifier shown in 600 is simplified and some components are not necessarily shown. Also for clarity, some of the connections shown may (only) correspond to an offset calibration mode and some connections or components corresponding to an operational mode are not necessarily shown.

Calibration engine 618 in this example sets the bodies of transistors 604 and 606 to a variety of test voltages, the results of which are evaluated via a feedback loop as observed via feedback signal 617. In one example, there are three possible voltages the bodies of transistors 604 and 606 can be set to:

[V$_0$, V$_1$, V$_2$]. In some embodiments, calibration engine 618 goes through all possible combinations and selects the pair having the best results. For example, calibration engine (when operating in a sweep mode) may go through (V$_{body,604}$=V$_0$, V$_{body,606}$=V$_0$), (V$_{body,604}$=V$_0$, V$_{body,606}$=V$_1$), (V$_{body,604}$=V$_0$, V$_{body,606}$=V$_2$), (V$_{body,604}$=V$_1$, V$_{body,606}$=V$_0$), etc. In some embodiments, as long as the selected voltage meets the convergence criteria the iteration stops on the first success to save time.

The gates of transistors 604 and 606 are connected (i.e., shorted) together during an offset calibration mode. (As described above, in an operational mode, the gates of transistors 604 and 606 may not necessarily be so connected.) Voltage offset 608 between the gates of transistors 604 and 606 is merely an illustration or example of the offset and there is not necessarily a voltage supply between the gates of transistors 604 and 606.

In a perfect system where transistors 604 and 606 are perfectly matched and have no offset, the voltage at nodes 610 and 612 will be the same. With offset, however, the two voltages at those nodes will be different. Nodes 610 and 612 are passed to the negative and positive inputs of differential flip flop (DFF) 614, respectively. DFF 614 outputs the difference of the positive and negative inputs (i.e., the voltage of node 612 minus the voltage of node 610). Comparator 616 looks for a change is the sign of the difference (i.e., when the output of DFF 614 goes from positive or negative, or vice versa). When comparator 616 sees this change in sign (e.g., from positive to negative or negative to positive) it will signal calibration engine via feedback signal 617 (e.g., a switch from a 0 to a 1 indicates there has been a change in the "sign" of the difference between nodes 610 and 612). In some embodiments, calibration engine 618 may stop and select the first pair of voltages which are flagged by the comparator 616. In some embodiments, the actual selected code from the calibration can be the one corresponding to just before the sign reversal, and in some embodiments, the selected code could be the one corresponding to just after the sign reversal.

The current through the drain (i.e., node 610 and 612) of transistors 604 and 606 is given by:

$$I_D = \frac{K}{2}\frac{W}{L}(V_{gs} - V_{thn})^2[1 + \lambda(V_{DS} - V_{sat})] \quad (1)$$

where V$_{gs}$ is the gate source voltage, λ is the early effect constant, V$_{DS}$ is the drain source voltage and V$_{sat}$ is the saturation voltage. K is a constant, W is the gate width of device and L the effective gate length of the device.

V$_{thn}$ is given by:

$$V_{thn} = V_{th0} + \lambda\left(\sqrt{V_{SB} + 2\Phi_F} - \sqrt{2\Phi_F}\right) \quad (2)$$

where V$_{th0}$ is the transistor threshold voltage with zero V$_{SB}$. V$_{SB}$ is the source to body voltage, $\Phi_F$ is the Fermi level and:

$$\lambda \propto \frac{1}{L\sqrt{V_{DS} - V_{dsat} + \Phi_0}} \quad (3)$$

where $\Phi_0$ is the built in voltage of an open-circuit PN junction.

Equation 2 above shows that properly biasing the body (i.e., V$_{SB}$) allows offset to be canceled as described herein.

In some embodiments, calibration engine 618 is used to calibrate a plurality of transistors. This may be attractive since some other offset techniques require multiple calibration circuits which takes up space.

Figure 7:
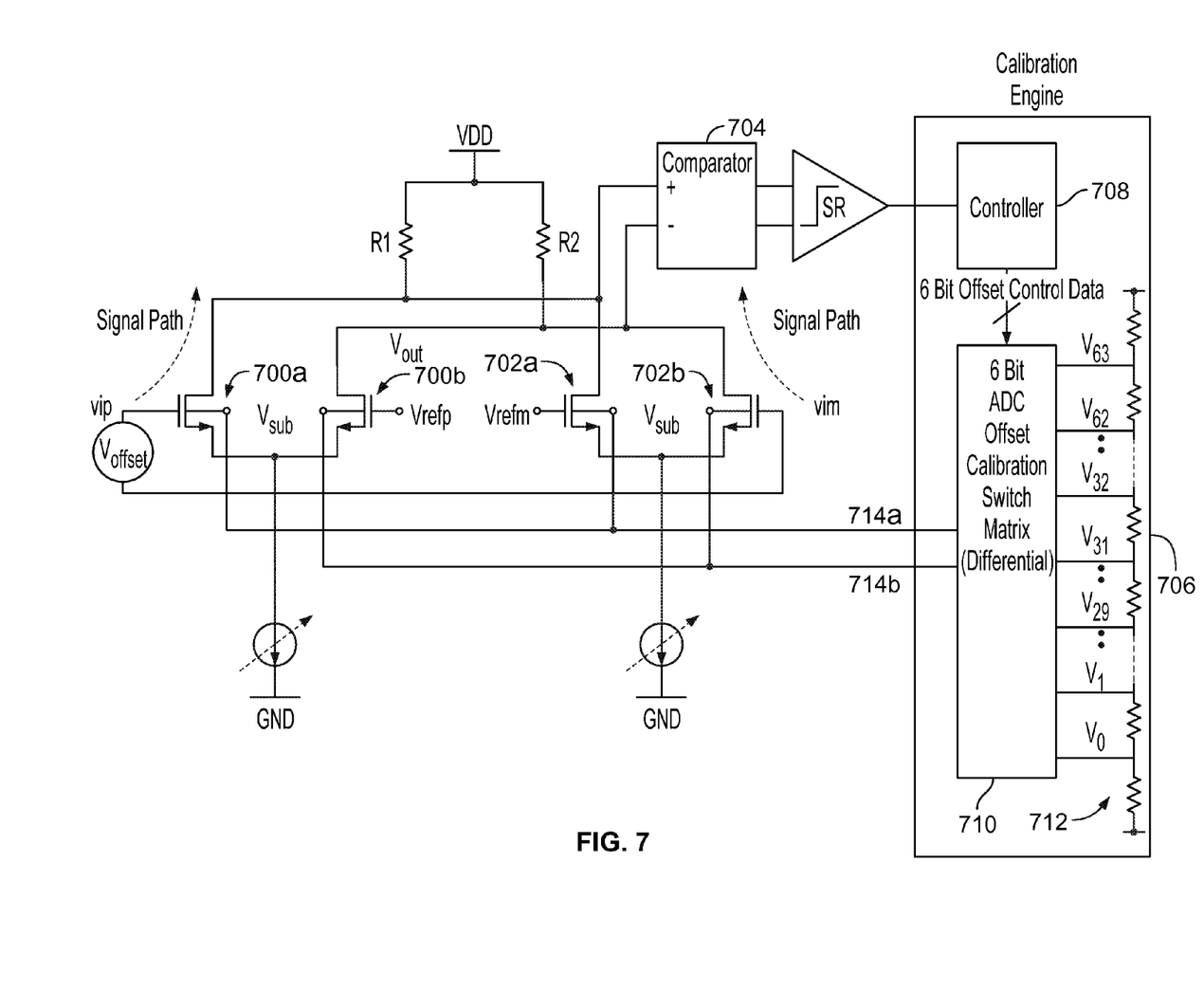
FIG. 7 is a diagram showing an embodiment of an ADC pre-amplifier having two matched pairs with an offset cancel calibration engine and a reference voltage ladder for the body input of the matched pairs.

FIG. 7 is a diagram showing an embodiment of a calibration engine with a voltage ladder and an ADC pre-amplifier having two matched pairs. In the example shown, the system is similar to that shown in FIG. 6 and as in FIG. 6 some connections and/or components (e.g., associated with an operational mode) are not necessarily shown for clarity.

Transistors 700a and 700b are a matched pair, as are transistors 702a and 702b. The gates of transistors 700a and 702b are connected to differential input signal during Vip and Vim an operation mode. The gates of transistors 700b and 702a are set/connected to Vrefp and vrefm which in some embodiments are reference voltages which are generated by ADC resister ladder and set the comparison or threshold voltages for the specific ADC slice. The drains of transistors 700a and 702a are connected together and are passed to the positive input of comparator 704. Similarly, the drains of transistors 700b and 702b are connected together and are passed to the negative input of comparator 704. The bodies of transistors 700a and 702a are tied together and set to the same voltage, as are the bodies of transistors 700b and 702b. In some embodiments, transistors 700a and 702a (which do not form a matched pair) occupy a single well and transistors 700b and 702b (which also do not form a matched pair) occupy a single well (albeit a different well from the one occupied by transistors 700a and 702a) as shown in FIG. 3.

Calibration engine 706 includes controller 708, matrix 710 and reference voltage ladder for body inputs 712. The engine is shared by all slices of ADC. In this example, there are 64 possible voltages the bodies of the transistors can be set to, which corresponds to 6 bits. Voltage ladder 712 generates the 64 possible voltages, V$_0$ thru V$_{63}$. Using a 6-bit control signal, controller 708 signals to matrix 710 when to switch the voltages going to the bodies of the transistors and what voltage to next set the bodies to. In some embodiments, the body voltages 714a and 714b are driven differentially from the voltage set 712, v0 thru v63 in the following fashion: [v0,v63],[v1, v62] ... [v31,v33],[v32,v32], [v33,v31], ... [v63,v0] such that there are 64 total possible pairs. In this example, matrix 710 is differential and so the control signal generated by controller 708 specifies the difference between the two body signals (i.e., the difference between nodes 714a and 714b) as opposed the specific voltages those lines are set to. Alternatively, in some embodiments a control signal specifies precisely what voltage a bias input is set to.

Figure 8:
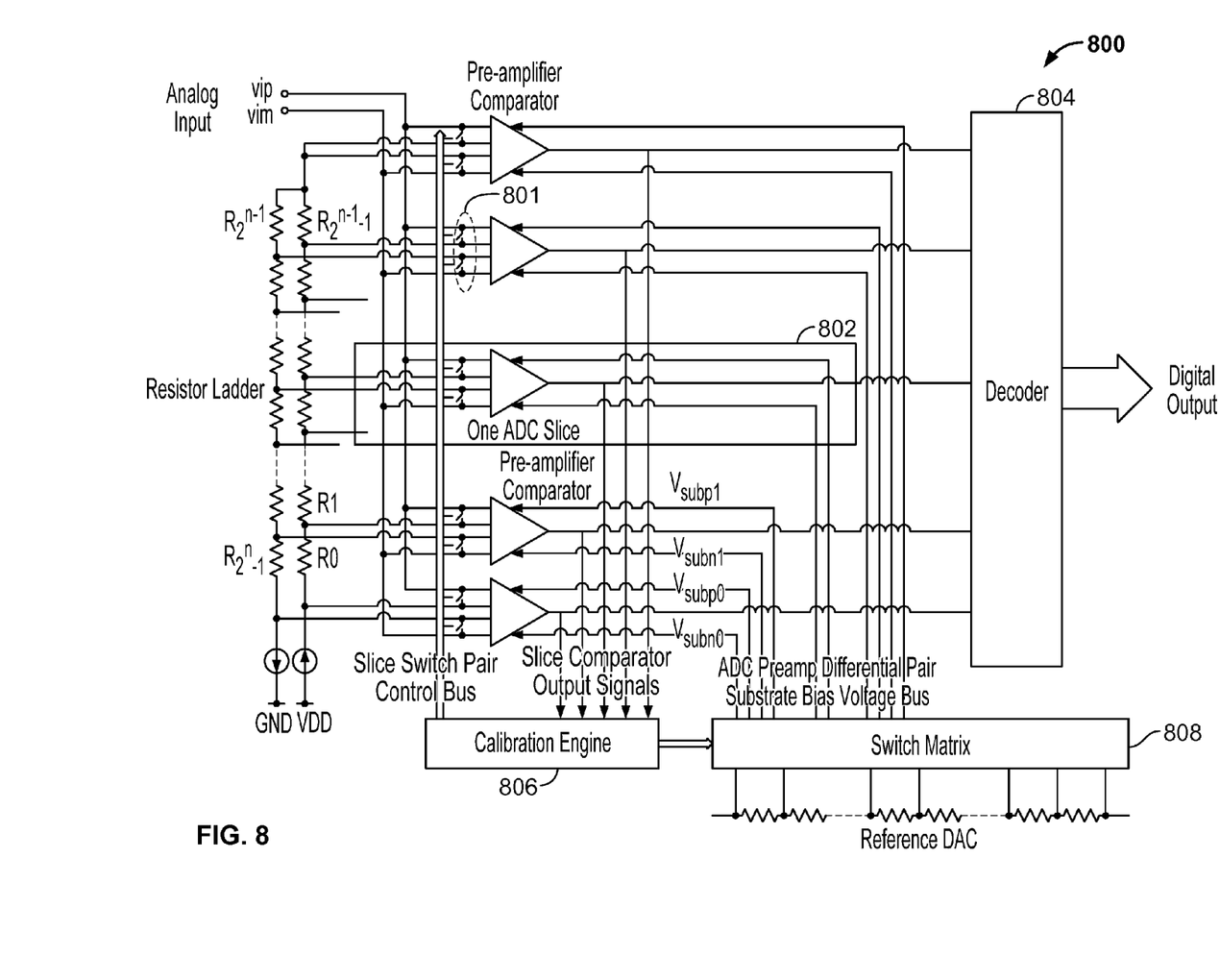
FIG. 8 is a diagram showing an embodiment of an ADC with switches to configure the system in either an offset calibration mode or an operational mode.

FIG. 8 is a diagram showing an embodiment of an ADC with switches to configure the system in either an offset calibration mode or an operational mode. In the example shown, an array of switches (including switches 801) is used to switch the system between an offset calibration mode and an operational mode. First, an offset calibration mode configuration will be described and then an operational mode configuration will be described.

System 800 includes a plurality of ADC slices, each slice of which includes a pre-amplifier. When the switches are in a first position (i.e., horizontal), the system is in an offset calibration mode and the pre-amplifiers in the ADC slices are connected to calibration engine 806. The outputs of each of the pre-amplifiers in the ADC slices are passed back to calibration engine which uses the outputs to select voltages to set the body inputs to (as described above). When in the offset calibration mode, the analog input (i.e., differential signals vip and vin) are not selected and those inputs are not necessarily set to or connected to anything. Similarly, the digital output generated by decoder 804 may not necessarily be producing anything of interest and the digital output may, in some cases, be ignored in an offset calibration mode. At the end of the offset calibration mode, each of the body voltages will be determined for the pre-amplifiers in each ADC slice and the voltages $V_{subn0}$, $V_{subp0}$, $V_{subn1}$, $V_{subp1}$, etc. are set to the appropriate voltage by switch matrix 808.

The switches are then moved to a second position (i.e., vertical) so that the pre-amplifiers in each ADC slice are connected to the analog inputs vip and vin. In this position system 800 is in an operational mode. Although calibration engine 806 may be off (if desired), switch matrix 808 continues to apply the voltages determined during the offset calibration mode to the bias inputs $V_{subn0}$, $V_{subp0}$, $V_{subn1}$, $V_{subp1}$, etc. Put another way, during operational mode, bias inputs $V_{subn0}$, $V_{subp0}$, $V_{subn1}$, $V_{subp1}$, etc. are not floating and are set to the voltages determined during the offset calibration mode. In operational mode, the outputs of each of the pre-amplifiers in the ADC slices are passed to decoder 804 which outputs a digital output (i.e., a digital version of the analog input). Thus, an analog input is converted into a digital output.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
    using a processor to determine a first voltage level and a second voltage level, wherein determining is based at least in part on: (1) a voltage at a drain of a first transistor from a first matched transistor pair connected to a drain of a third transistor from a second matched transistor pair and (2) a voltage at a drain of a second transistor from the first matched transistor pair connected to a drain of a fourth transistor from the second matched transistor pair;
    setting a body input of the first transistor to the determined first voltage level and a body input of the second transistor to the determined second voltage level to reduce an offset between the first transistor and the second transistor in the first matched transistor pair; and
    setting a body input of the third transistor to the determined first voltage level and a body input of the fourth transistor to the determined second voltage level to reduce an offset between the third transistor and the fourth transistor in the second matched transistor pair, wherein:
        the body input of the first transistor is connected to the body input of the third transistor; and
        the body input of the second transistor is connected to the body input of the fourth transistor.

2. The method of claim 1, wherein the first matched transistor pair and the second matched transistor pair are included in one or more of the following: a pre-amplifier or an analog to digital converter (ADC).

3. The method of claim 1 further comprising switching between an offset calibration mode, during which the processor is used to determine the first voltage level and the second voltage level, and an operational mode.

4. The method of claim 3, wherein switching includes changing an input selected by a switch.

5. The method of claim 1, wherein a single well having a common body input is occupied by both the first transistor and the third transistor.

6. The method of claim 1, wherein at least one of the following includes a silicon on insulator (SOI) transistor: the first matched transistor pair or the second matched transistor pair.

7. The method of claim 1, wherein using the processor to determine includes:
    setting a body input to one of a plurality of candidate voltages;
    converting an analog signal associated with the transistor to a digital signal; and
    determining if the digital signal matches a desired signal.

8. The method of claim 7, wherein:
    converting the analog signal associated with the transistor to the digital signal includes using a differential flip flop (DFF) which generates a difference, having a sign, between a positive input and a negative input; and
    determining if the digital signal matches a desired signal includes using a comparator configured to search for a change in the sign of the difference generated by the DFF.

9. The method of claim 7, wherein setting the body input to one of a plurality of candidate voltages includes using a voltage ladder to simultaneously generate all of the plurality of candidate voltages.

10. The method of claim 1, wherein using the processor to determine further includes connecting a gate input of the first transistor to a gate input of the third transistor.

11. A system, comprising:
    a processor configured to:
        determine a first voltage level and a second voltage level, wherein determining is based at least in part on: (1) a voltage at a drain of a first transistor from a first matched transistor pair connected to a drain of a third transistor from a second matched transistor pair and (2) a voltage at a drain of a second transistor from the first matched transistor pair connected to a drain of a fourth transistor from the second matched transistor pair;
        set a body input of the first transistor to the determined first voltage level and a body input of the second transistor to the determined second voltage level to reduce an offset between the first transistor and the second transistor in the first matched transistor pair; and
        set a body input of the third transistor to the determined first voltage level and a body input of the fourth transistor to the determined second voltage level to reduce an offset between the third transistor and the fourth transistor in the second matched transistor pair;
    the first matched transistor pair which includes the first transistor and the second transistor; and
    the second matched transistor pair which includes the third transistor and the fourth transistor, wherein:
        the body input of the first transistor is connected to the body input of the third transistor; and
        the body input of the second transistor is connected to the body input of the fourth transistor.

12. The system of claim 11, wherein the first matched transistor pair and the second matched transistor pair are included in one or more of the following: a matched transistor pair, a pre-amplifier or an analog to digital converter (ADC).

13. The system of claim 11, wherein the processor is further configured to switch between an offset calibration mode, during which the processor is used to determine the first voltage level and the second voltage level, and an operational mode.

14. The system of claim 13, wherein switching includes changing an input selected by a switch.

15. The system of claim 11, wherein a single well having a common body input is occupied by both the first transistor and the third transistor.

16. The system of claim 11, wherein at least one of the following includes a silicon on insulator (SOI) transistor: the first matched transistor pair or the second matched transistor pair.

17. The system of claim 11, wherein the processor is configured to determine by:
- setting a body input one of a plurality of candidate voltages;
- converting an analog signal associated with the transistor to a digital signal; and
- determining if the digital signal matches a desired signal.

18. The system of claim 17, wherein:
- the processor is configured to convert the analog signal associated with the transistor to the digital signal by using a differential flip flop (DFF) which generates a difference, having a sign, between a positive input and a negative input; and
- the processor is configured to determine if the digital signal matches a desired signal by using a comparator configured to search for a change in the sign of the difference generated by the DFF.

19. The system of claim 17, wherein the processor is configured to set the body input to one of a plurality of candidate voltages by using a voltage ladder to simultaneously generate all of the plurality of candidate voltages.

20. The system of claim 11, wherein the processor is configured to determine further including by connecting a gate input of the first transistor to a gate input of the third transistor.

21. A computer program product, the computer program product being embodied in a non-transitory computer readable storage medium and comprising computer instructions for:
- determining a first voltage level and a second voltage level, wherein determining is based at least in part on: (1) a voltage at a drain of a first transistor from a first matched transistor pair connected to a drain of a third transistor from a second matched transistor pair and (2) a voltage at a drain of a second transistor from the first matched transistor pair connected to a drain of a fourth transistor from the second matched transistor pair;
- setting a body input of the first transistor to the determined first voltage level and a body input of the second transistor to the determined second voltage level to reduce an offset between the first transistor and the second transistor in the first matched transistor pair; and
- setting a body input of the third transistor to the determined first voltage level and a body input of the fourth transistor to the determined second voltage level to reduce an offset between the third transistor and the fourth transistor in the second matched transistor pair, wherein:
    - the body input of the first transistor is connected to the body input of the third transistor; and
    - the body input of the second transistor is connected to the body input of the fourth transistor.

* * * * *